United States Patent [19]
Kim

[11] Patent Number: 5,516,722
[45] Date of Patent: May 14, 1996

[54] METHOD FOR INCREASING DOPING UNIFORMITY IN A FLOW FLANGE REACTOR

[75] Inventor: Tae S. Kim, Dallas, Tex.

[73] Assignee: Texas Instruments Inc., Dallas, Tex.

[21] Appl. No.: 331,844

[22] Filed: Oct. 31, 1994

[51] Int. Cl.$^6$ .................................................. H01L 21/20
[52] U.S. Cl. ........................... 437/105; 437/107; 437/126; 437/133; 117/84
[58] Field of Search ...................................... 437/105, 107, 437/126, 133; 117/84

[56] References Cited

U.S. PATENT DOCUMENTS

| | | | |
|---|---|---|---|
| 4,579,623 | 4/1986 | Suzuki et al. | 118/728 |
| 4,980,204 | 12/1990 | Fujii et al. | 427/255.2 |
| 5,304,247 | 4/1995 | Kondo et al. | 437/126 |
| 5,472,507 | 12/1995 | Yamaguchi et al. | 118/723 MP |

OTHER PUBLICATIONS

"Emcore GS3200 flow flange reactor" Technical literature, Sep. 22, 1987.

Primary Examiner—R. Bruce Breneman
Assistant Examiner—Ramamohan Rao Paladugu
Attorney, Agent, or Firm—William B. Kempler; Richard L. Donaldson

[57] ABSTRACT

The present invention comprises a method and apparatus for increasing doping uniformity in semiconductor devices produced in a flow flange reactor. One aspect of the present invention involves dividing the flow flange (12) of the reactor into a plurality of sections (14, 16, 18). Each section (14, 16, 18) is then subdivided into a plurality of subsections (52, 54, 56) including a first subsection (52), a second subsection (54) and a third subsection (56). A group III gas may then be dispersed in the first subsection (52) of at least one section (18). A group V gas may then be dispersed in a second subsection (54) of that section, while a dopant gas may also be dispersed in a third subsection (56) of that section (18).

11 Claims, 3 Drawing Sheets

METHOD FOR INCREASING DOPING UNIFORMITY IN A FLOW FLANGE REACTOR

CROSS-REFERENCE TO RELATED APPLICATIONS

This application is related to U.S. application Ser. No. 08/332,192, Attorney's Docket No. TI-19038, filed on Oct. 31, 1994 by Tae S. Kim and entitled "Method and Apparatus For Achieving a Desired Thickness Profile in a Flow-Flange Reactor", pending.

TECHNICAL FIELD OF THE INVENTION

This invention relates generally to organometallic vapor phase epitaxy and more particularly to an apparatus and method for increasing doping uniformity in a semiconductor device grown in a flow flange reactor.

BACKGROUND OF THE INVENTION

A commonly used epitaxial growth technique for gallium arsenide semiconductors is organometallic vapor phase epitaxy (OMVPE). The uniformity of the doping of a given epitaxial layer is an important factor to control during the OMVPE process.

One reactor widely used for OMVPE processing is known as a flow flange reactor. An example of a flow flange reactor is the GS3200 manufactured by EMCORE of Somerset, N.J. In the EMCORE flow flange configuration, the flow flange of the growth chamber has three divided concentric sections, also known as gas dispersing rings, through which source gases are injected and dispersed. The three gas dispersing rings are also divided in half at the center, such that group III and group V source gases may be separately injected. Typically, the Group 3 and dopant source gases are injected into one side of the three sections and group V source gases are injected into the other side. The ratios of the input flows of the group III source gases to the three gas dispersing rings typically determine the thickness profile on the layer being epitaxially grown. Accordingly, the group III gas input flow ratios are ordinarily fixed and may not be adjusted to aid in achieving doping uniformity because the thickness profile of the layer being grown would be disturbed.

In the EMCORE configuration and other flow flange reactor configurations, dopant source gases are typically injected along with the group III source gases and in approximately the same ratio as the group III source gases. This configuration assumes that doping uniformity results from maintaining the ratios of dopant source flow the same as the input flow ratios for the group III gas sources. Often, as is the case in the EMCORE configuration, the dopant source gases are injected along with the group III source gases through a common gas control. A gas control is also known as a gas injector. A gas control may be, for example, a metering valve or a mass flow controller. The above assumption regarding doping uniformity, however, proves to be false. Doping uniformity is often affected by growth conditions such as the input flow ratios between the group V and group III gases, growth temperature, and, in the case of low doping levels, background doping levels. In current configurations, group V gas sources are injected into one side of the flow flange while group III and dopant sources are injected into the other side of the flow flange. Current reactor configurations are inadequate for achieving the desired degree of doping uniformity over a wide range of doping levels.

SUMMARY OF THE INVENTION

Accordingly, a need has arisen for an improved method and apparatus for increasing doping uniformity in semiconductor devices produced in a flow flange reactor. One aspect of the invention is a method for increasing doping uniformity in a flow flange reactor. The flow flange reactor is first divided into a plurality of sections, with each section further subdivided into a plurality of subsections, including a first subsection, a second subsection and a third subsection. A group III gas is dispersed in the first subsection of one of the sections while a group V gas is dispersed in the second subsection of that section and a dopant gas is dispersed in the third subsection of that section. In other sections of the flow flange, a different type of gas may be dispersed in the subsection radially adjacent to the first section for further control of doping uniformity.

An important technical advantage of the present invention is that doping uniformity may be more easily achieved. Because doping uniformity may be more easily achieved, the OMVPE process is easier to control. By achieving better doping uniformity, higher quality semiconductor devices may be produced. Moreover, devices with lower tolerance ranges for nonuniformities may be produced.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

The present invention and its advantages are best understood by referring to FIGS. 1 through 5 of the drawings, like numerals being used for like and corresponding parts of the various drawings.

Figure 1:
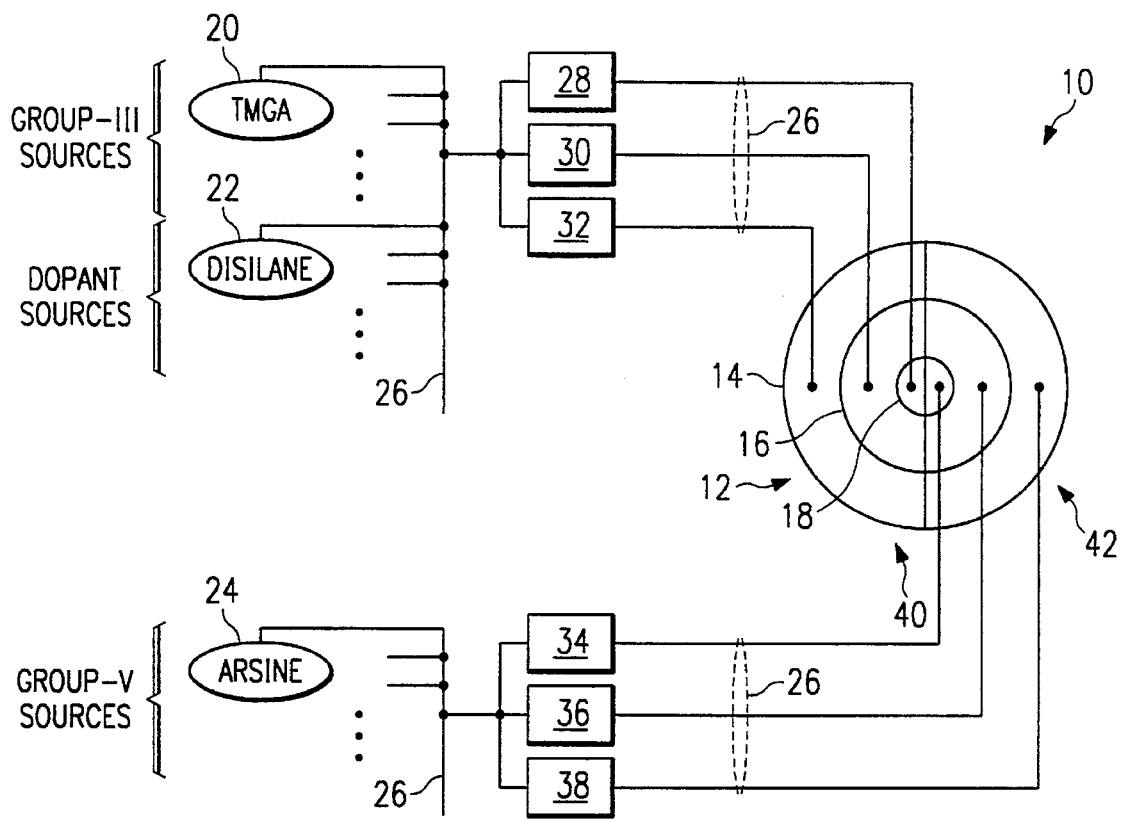
FIG. 1 illustrates a prior art flow flange reactor that may be reconfigured in accordance with the teachings of the present invention.

FIG. 1 illustrates an existing flow-flange reactor 10. Flow-flange reactor 10 comprises flow-flange 12, gas sources 20, 22, 24, pipes 26 and gas controls 28, 30, 32, 34, 36 and 38. Flow-flange reactor 10 will be used as an example to illustrate the methods of the present invention. The invention, however, is not limited to use with flow-flange reactor 10; the invention may be used with any flow-flange reactor.

Flow-flange 12 may be divided into a plurality of sections. Each section may be further subdivided into a plurality of subsections. In the embodiment illustrated in FIG. 1, flow-flange 12 is divided into three sections and each section is further subdivided into two subsections.

The three sections of the embodiment of flow-flange 12 illustrated in FIG. 1, which may also be referred to as gas dispersing rings, include outer ring 14, middle ring 16 and inner ring 18. Each ring or section is further subdivided into two subsections, denoted as first half 40 and second half 42.

The rates of gas flow into first half 40 and second half 42 of outer ring 14, middle ring 16 and inner ring 18 are controlled by gas controls 28, 30, 32, 34, 36 and 38. Gas controls 28, 30, 32, 34, 36 and 38 may be, for example, manually controlled metering valves or electronically controlled mass-flow controllers. Gas controls 28, 30 and 32 control the flow rate of gas to first half 40 of inner ring 18, middle ring 16, and outer ring 14, respectively. Gas controls 34, 36 and 38 control the flow rate of gases to second half 42 of inner ring 18, middle ring 16 and outer ring 14, respectively.

Flow-flange reactor 10 may also include a plurality of group III gas sources 20, a plurality of dopant gas sources 22 and a plurality of group 5 gas sources 24. Group III gas sources may include, for example, sources of trimethyl gallium and trimethyl aluminum. Group V gas sources 24 may include, for example, sources of arsine. Dopant gas sources 22 may include, for example, sources of disilane. Other types of gas may be supplied by group III gas sources 20, dopant gas sources 22 and group V gas sources 24 without departing from the scope and teachings of the present invention. In addition, only one gas source of each type could be used.

Pipes 26 connect gas sources 20, 22 and 24 to gas controls 28, 30, 32, 34, 36 and 38. Pipes 26 also connect gas controls 28, 30, 32, 34, 36 and 38 to first half 40 of inner ring 18, middle ring 16, and outer ring 14 as well as to second half 42 of inner ring 18, middle ring 16 and outer ring 14. The embodiment illustrated in FIG. 1 has a single pipe 26 connecting gas controls 28, 30 and 32 to group III gas sources 20 and dopant gas sources 22 and a single pipe connecting gas controls 34, 36 and 38 to group V gas sources 24. Alternatively, each gas control 28, 30, 32, 34, 36 and 38 may be directly connected by a pipe 26 to any one or more group III gas sources 20, dopant gas sources 22 or group V gas sources 24. In other words, each gas control 28, 30, 32, 34, 36 and 38 may have its own pipe 26 connecting that gas control to one or more of the gas sources 20, 22 and 24.

Figure 2:
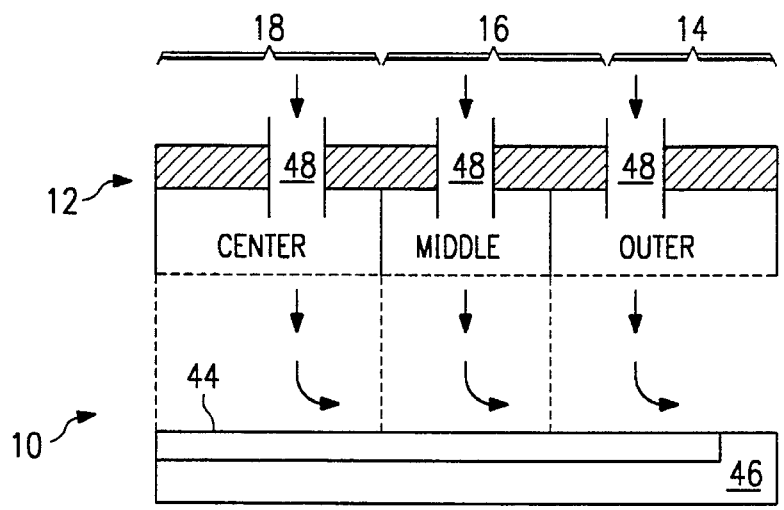
FIG. 2 illustrates a side view of a portion of the flow flange reactor of FIG. 1.

FIG. 2 illustrates a cutaway side view of a portion of flow-flange reactor 10. This figure illustrates how gases flow through flow-flange 12 and over the surface of wafer 44. Wafer 44 is coupled to wafer carrier 46. During the growth process, gases flow through openings 48 in flow-flange 12 in the general direction illustrated by the arrows and over the surface of wafer 44.

Figure 3:
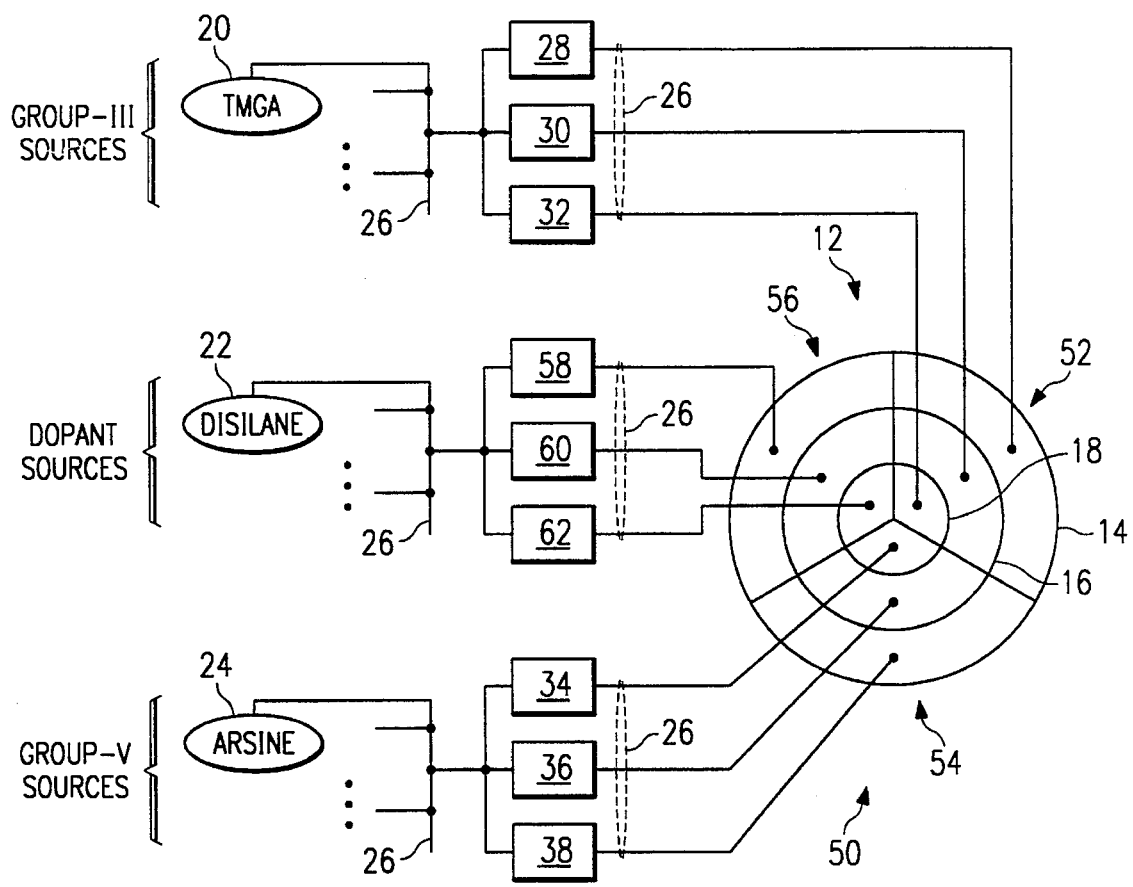
FIG. 3 illustrates one embodiment of a flow flange reactor constructed in accordance with the teachings of the present invention.

FIG. 3 illustrates an embodiment of a flow flange reactor 50 constructed in accordance with the teachings of the present invention. Unlike flow flange reactor 10 of FIG. 1, flow flange 12 in flow flange reactor 50 has been divided into a first subsection 52, second subsection 54 and third subsection 56.

Flow flange reactor 50 further comprises gas controls 58, 60 and 62. Gas controls 58, 60 and 62 may be, for example, metering valves or mass flow controllers. Gas controls 58, 60 and 62 may control the flow rate of dopant gases from dopant gas sources 22 to third subsection 56 of outer ring 14, middle ring 16 and inner ring 18, respectively. Similarly, gas controls 28, 30, and 32 may control the flow rate of group III gases from group III gas sources 20 to first subsection 52 of outer ring 14, middle ring 16 and inner ring 18, respectively. Gas controls 34, 36 and 38 may control the flow of group V gases from group V gas sources 24 to second subsection 54 of inner ring 18, middle ring 16 and outer ring 14, respectively.

In this embodiment of the invention, dopant gases may be dispersed through flow flange 12 in a different subsection from the subsection where group III gas sources are dispensed. In other words, the invention allows the input flow ratios for dopant source gases to be controlled independently of the input flow ratios for group III sources gases. Because the input flow ratios of dopant source gases can be controlled independently, doping uniformity is more easily controlled.

In the embodiment illustrated in FIG. 3, flow flange 12 has been divided into three sections—outer ring 14, middle ring 16, and inner ring 18. However, flow flange 12 could be divided into more or less sections without departing from the scope and teachings of the present invention. In addition, these sections comprise circular-shaped concentric sections. Sections of a different shape or arrangement could be used without departing from the scope and teachings of the present invention.

In FIG. 3 flow flange 12 has also been divided into three subsections—first subsection 52, second subsection 54 and third subsection 56. Each section could be divided into a different number of subsections without departing from the scope and teachings of the present invention. Moreover, the subsections illustrated in FIG. 3 have substantially equal surface areas. However, each section could be divided into subsections having differing surface areas without departing from the scope and teachings of the present invention.

As will be more fully explained in connection with FIG. 4, doping uniformity may also be controlled by dispersing a group V gas in a subsection radially adjacent to a subsection dispersing a group III gas. For example, in FIG. 3, a group V gas could be injected into second subsection 54 of outer ring 14 and a group III gas could be injected into second subsection 54 of middle ring 16. The same subsection of the three rings, therefore, could have different types of gas flowing in them. By dispersing dissimilar gases in radially adjacent subsections of different sections, doping uniformity is more easily controlled. Ordinarily, each ring will have one subsection where a group III gas is being dispersed, one subsection where a dopant gas is being dispersed, and one subsection where a group V gas is being dispersed. The present invention, however, does not require this structure.

Because the input flow ratios for the dopant gases may now be controlled independently of the group III gas sources 20, doping uniformity may be controlled by adjusting the input flow ratios of gas controls 58, 60 and 62. These input flow ratios may be adjusted using a linear model. By using a plurality of sets of sample input flow ratios of the dopant gas sources 22, and measuring the resulting sample doping uniformity, one can determine a linear relationship between input flow ratios of the dopant gas sources 22 and doping uniformity. After the linear relationship has been determined, it can be used to derive optimal input flow ratios for gas controls 58, 60 and 62 based upon the desired uniformity of doping.

Flow flange reactor 50 of FIG. 3 has a novel flow flange. It is desirable, however, to be able to increase doping uniformity by making only slight modifications to existing flow flange reactor 10. FIG. 4 illustrates modifications to flow flange reactor 10 made in accordance with the teachings of the present invention that allow an increase in doping uniformity. In this embodiment of the invention, a group V gas can be dispersed to one-half of a given ring radially adjacent to the same half of another ring where a group III gas is being dispersed. By dispersing group III and group V gases in radially adjacent subsections of flow flange 12, doping uniformity can be more easily controlled by adjusting the input flow ratios between group V gas sources and group III gas sources. In this embodiment, dopant gases are dispersed with group III gases. The invention allows group III and group V gas sources to be dispersed in an alternating sequence. By dispersing gases in this manner, the chances of interaction between the gases is increased, thus allowing better control over doping uniformity and a more direct relationship between doping uniformity and group V to group III input flow ratios.

Figure 4:
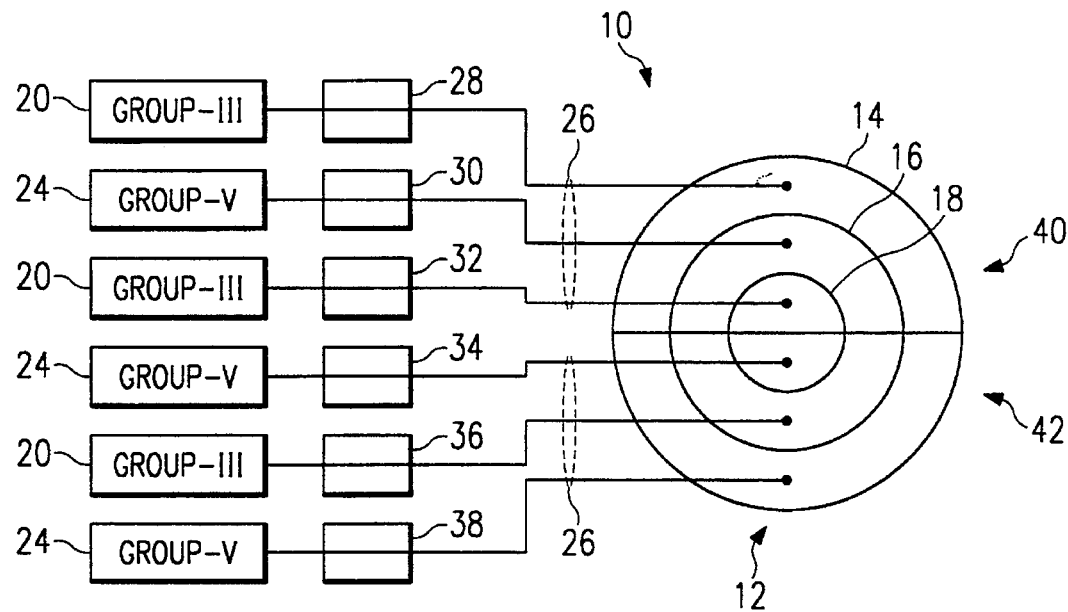
FIG. 4 illustrates a second embodiment of a flow flange reactor configured in accordance with the teachings of the present invention.

One important difference between the configuration of the existing flow flange reactor 10 of FIG. 1 and the reconfigured flow flange reactor 10 of FIG. 4 is that each of the gas controls 28, 30, 32, 34, 36 and 38 may be connected to group III and group V gas sources in an alternating fashion. For example, gas controls 28 and 32 may connect to a group III gas source 20, while gas control 30 may connect to a group V gas source 24. Similarly, gas controls 34 and 38 may be connected to a group V gas source 24 and gas control 36 may be connected to group III gas source 20. Alternatively, each of gas controls 28, 32, and 36 may be connected to the same group III gas source 20, or to independent group III gas sources 20. Also, two or more of gas controls 28, 32, and 36 may share a group III gas source 20 while one or more of gas controls 28, 32 and 36 may be independently coupled to a group III gas source 20. The same is true for group V gas sources—any group V gas source 24 may have one or more gas controls coupled to it.

To generalize, flow flange 12 may be divided into a plurality of sections, which in this embodiment includes outer ring 14, middle ring 16 and inner ring 18. As discussed above, the sections are circular and concentric but may be any appropriate shape and arrangement without departing from the scope and teachings of the present invention. Each section may be further divided into subsections. In the embodiment shown in FIG. 4, flow flange 12 may be divided into a first half 40 (first subsection) and second half 42 (second subsection). Therefore, a group V gas may be dispersed in one subsection of a given section and in a second subsection of a second section radially adjacent to the first section. A group III gas may then be dispersed in the second subsection of the first section as well as in the first subsection of the second section.

For example, in the embodiment illustrated in FIG. 4, a group III gas is dispersed in a first subsection (first half 40) of a first subsection (inner ring 18) as well as a second subsection (second half 42) of a second section (middle ring 16). A group V gas is then dispersed in a second subsection (second half 42) of the first section (inner ring 18) as well as a first subsection (first half 40) of the second section (middle ring 16). By dispersing a group V gas in a subsection radially adjacent to the same subsection of a different section, the present invention obtains the advantages of better doping uniformity.

To control the uniformity of doping with the embodiment of the invention illustrated in FIG. 4, a linear model may be developed using a plurality of sets of sample input flow ratios between the group V and group III gasses. After epitaxially growing layers of a semiconductor device using sets of sample input flow ratios between the group V and group III gases, the doping uniformity can be measured and a number of sample doping uniformity profiles defined. A linear relationship may then be determined between the sets of sample input flow ratios and the resulting doping uniformity profile produced using those sets of flow ratios. After this linear relationship has been developed, it can be used to compute a set of optimal input flow ratios between the group V and group III gasses using the desired doping uniformity profile for the semiconductor device.

Figure 5:
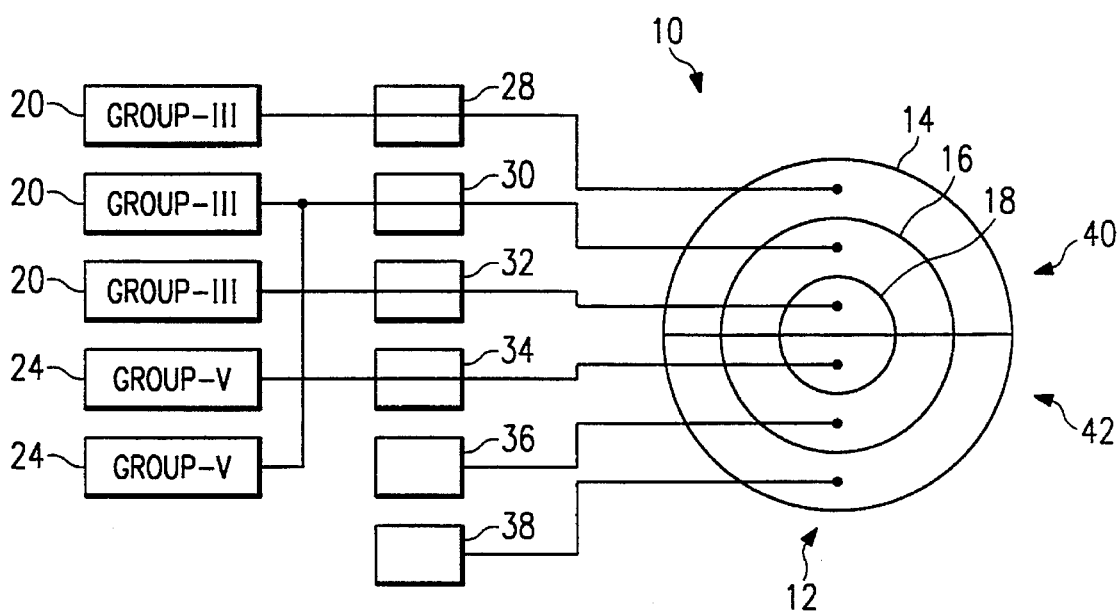
FIG. 5 illustrates a third embodiment of a flow flange reactor configured in accordance with the teachings of the present invention.

An alternative configuration of flow flange reactor 10 is illustrated in FIG. 5. In this embodiment, group V and group III gas sources may be coupled to the same gas flow controller. In the embodiment illustrated in FIG. 5, both a group III gas source 20 and a group V gas source 24 are coupled to gas control 30. However, some gas phase reaction will occur between the reactant gases within the flow flange itself, thus lessening control over the process. This configuration, however, and apparent variations thereon, may also be used to control doping uniformity in a flow flange reactor. The embodiments illustrated in FIGS. 3 and 4, are preferable, however, because of the gas phase reactions occurring between the reactant gasses flowing in FIG. 5.

Although the present invention and its advantages have been described in detail it should be understood that various changes, substitutions and alterations can be made therein without departing from the spirit and scope of the invention as defined by the appended claims.

What is claimed is:

1. A method for increasing doping uniformity in a semiconductor device processed in a flow-flange reactor, comprising the steps of:

dividing the flow flange of the reactor into a plurality of sections;

subdividing each of said plurality of sections into a plurality of subsections, including a first subsection, a second subsection, and a third subsection;

dispersing an active gas consisting essentially of a first gas in said first subsection of at least one said section;

dispersing an active gas consisting essentially of a second gas in said second subsection of said at least one section; and dispersing an active gas consisting essentially of a third gas in said third subsection of said at least one section, wherein said first, second and third gases are different from each other.

2. The method of claim 1 wherein each of said plurality of sections comprises a circular shaped concentric section.

3. The method of claim 1, wherein each said subsection within a specific one of said plurality of sections has equal surface area.

4. The method of claim 2, further comprising the step of dispersing said second gas in a subsection radially adjacent to said first subsection of said at least one section.

5. The method of claim 2, further comprising the step of dispersing said first gas in a subsection radially adjacent to said second subsection of said at least one section.

6. The method of claim 2, further comprising the step of dispersing said third gas in a subsection radially adjacent to said first subsection of said at least one section.

7. The method of claim 4, further comprising the step of dispersing said first gas in a subsection radially adjacent to said second subsection of said at least one section.

8. The method of claim 2, further comprising the steps of dispersing said first gas in a subsection radially adjacent to said first subsection of said at least one section;

dispersing said second gas in a subsection radially adjacent to said second subsection of said at least one section;

dispersing said third gas in a subsection radially adjacent to said third subsection of said at least one section; and wherein said first gas comprises a group III gas, said second gas comprises a group V gas, and said third gas comprises a dopant gas.

9. A method for increasing doping uniformity in a semiconductor device produced in a flow-flange reactor, comprising the steps of:

dividing the flow flange of the reactor into a plurality of sections including a first section radially adjacent to a second section;

subdividing each of said plurality of sections into a plurality of subsections, including a first subsection and a second subsection, said first subsection of said first section radially adjacent to said first subsection of said second section, said second subsection of said first section radially adjacent to said second subsection of said second section;

dispersing a group III gas in said first subsection of said first section and said second subsection of said second section; and dispersing a group V gas in said second subsection of said first section and said first subsection of said second section to produce an alternating dispersion of Group III gas, Group V gas, Group III gas, Group V gas.

10. The method of claim 9 wherein said sections comprise circular shaped concentric sections.

11. The method of claim 9, further comprising the step of dispersing a dopant gas in said first subsection of said first section.

* * * * *